(12) United States Patent
Xie et al.

(10) Patent No.: US 12,274,122 B2
(45) Date of Patent: Apr. 8, 2025

(54) DISPLAY SUBSTRATE AND METHOD OF MANUFACTURING THE SAME, AND DISPLAY APPARATUS

(71) Applicant: BOE TECHNOLOGY GROUP CO., LTD., Beijing (CN)

(72) Inventors: Chunyan Xie, Beijing (CN); Song Zhang, Beijing (CN); Ziyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 512 days.

(21) Appl. No.: 17/631,273

(22) PCT Filed: Feb. 20, 2021

(86) PCT No.: PCT/CN2021/077063
§ 371 (c)(1),
(2) Date: Jan. 28, 2022

(87) PCT Pub. No.: WO2021/164766
PCT Pub. Date: Aug. 26, 2021

(65) Prior Publication Data
US 2022/0263048 A1    Aug. 18, 2022

(30) Foreign Application Priority Data
Feb. 21, 2020 (CN) .......................... 202020197621.4

(51) Int. Cl.
*H10K 50/844* (2023.01)
*H10K 59/122* (2023.01)
*H10K 71/00* (2023.01)

(52) U.S. Cl.
CPC ......... *H10K 50/844* (2023.02); *H10K 59/122* (2023.02); *H10K 71/00* (2023.02)

(58) Field of Classification Search
CPC .... H10K 50/844; H10K 59/122; H10K 71/00; H10K 59/873; H10K 59/124
See application file for complete search history.

(56) References Cited

U.S. PATENT DOCUMENTS 11,329,255 B2 *  5/2022  Lim ..................... H10K 59/122
11,411,199 B2 *  8/2022  Seong ................ H10K 50/8428
(Continued)

FOREIGN PATENT DOCUMENTS

CN    106409867 A    2/2017
CN    110212113 A    9/2019
(Continued)

OTHER PUBLICATIONS

Office Action for Chinese Patent Application No. 202020197621.4 issued by the Chinese Patent Office on Jun. 15, 2020.

*Primary Examiner* — Kevin Quarterman
(74) *Attorney, Agent, or Firm* — XSENSUS LLP

(57) ABSTRACT

A display substrate includes a substrate, at least one protruding structure, a water-oxygen barrier pattern, and a display layer. The substrate has a display area, an opening located in the display area, and an isolation region disposed around the opening. The at least one protruding structure is disposed on the substrate and located in the isolation region. The water-oxygen barrier pattern covers the at least one protruding structure and located in the isolation region. The display layer is disposed on the substrate, a portion of the display layer is located in the display area, and a remaining portion of the display layer extends into the isolation region and is located at a side of the water-oxygen barrier pattern away from the substrate.

20 Claims, 13 Drawing Sheets

(56) References Cited

U.S. PATENT DOCUMENTS

| | | | |
|---|---|---|---|
| 11,456,437 B2* | 9/2022 | Kim | H10K 59/12 |
| 11,462,714 B2* | 10/2022 | Yun | H10K 59/873 |
| 2017/0031323 A1 | 2/2017 | Kim et al. | |
| 2021/0273194 A1 | 9/2021 | Xie et al. | |

FOREIGN PATENT DOCUMENTS

| CN | 211719594 U | 10/2020 |
|---|---|---|
| JP | 5151739 B2 | 2/2013 |

\* cited by examiner

DISPLAY SUBSTRATE AND METHOD OF MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/077063, filed on Feb. 20, 2021, which claims priority to Chinese Patent Application No. 202020197621.4, filed on Feb. 21, 2020, which are incorporated herein by reference in their entirety.

TECHNICAL FIELD

The present disclosure relates to the field of display technologies, and in particular, to a display substrate and a method of manufacturing the same, and a display apparatus.

BACKGROUND

Organic light-emitting diodes (OLEDs) are widely used in the display field due to their advantages of high brightness, full viewing angle, fast response speed, flexible display, etc.

SUMMARY

In an aspect, a display substrate is provided. The display substrate includes a substrate, at least one protruding structure, a water-oxygen barrier pattern, and a display layer. The substrate has a display area, an opening located in the display area, and an isolation region disposed around the opening and located between the display area and the opening. The at least one protruding structure is disposed on the substrate and located in the isolation region. The water-oxygen barrier pattern covers the at least one protruding structure and is located in the isolation region. The display layer is disposed on the substrate, a portion of the display layer located in the display area, and a remaining portion of the display layer extends into the isolation region and is located on a side of the water-oxygen barrier pattern away from the substrate.

In some embodiments, the water-oxygen barrier pattern has at least one through hole.

In some embodiments, the at least one protruding structure includes a protruding structure disposed around the opening. Compared to an orthogonal projection of the protruding structure on the substrate, an orthogonal projection of the at least one through hole on the substrate is closer to the opening.

In some embodiments, the at least one protruding structure includes a plurality of protruding structures disposed around the opening from the inside to the outside. Compared to an orthogonal projection of the outermost one protruding structure of the plurality of protruding structures on the substrate, an orthogonal projection of the at least one through hole on the substrate is closer to the opening.

In some embodiments, the at least one through hole is located between two adjacent protruding structures of the plurality of protruding structures.

In some embodiments, the at least one protruding structure has a first surface and a second surface opposite to each other, and the first surface is farther away from the substrate than the second surface. The at least one through hole is disposed in a portion of the water-oxygen barrier pattern that is opposite to the first surface.

In some embodiments, the at least one through hole includes a single through hole disposed around the opening, or a plurality of through holes spaced around the opening.

In some embodiments, the display substrate further includes a thin film encapsulation layer covering the display layer and the water-oxygen barrier pattern. The thin film encapsulation layer includes a first inorganic sub-encapsulation layer, an organic sub-encapsulation layer, and a second inorganic sub-encapsulation layer that are sequentially stacked in a thickness direction of the substrate. A border of a portion of the first inorganic sub-encapsulation layer extending into the isolation region and a border of a portion of the second inorganic sub-encapsulation layer extending into the isolation region are closer to the opening than a border of a portion of the organic sub-encapsulation layer extending into the isolation region.

In some embodiments, an orthogonal projection of the at least one through hole on the substrate is closer to the opening than an orthogonal projection of the organic sub-encapsulation layer on the substrate.

In some embodiments, the at least one protruding structure includes a plurality of protruding structures disposed around the opening from the inside to the outside. The first inorganic sub-encapsulation layer and the second inorganic sub-encapsulation layer cover all the protruding structures, and the organic sub-encapsulation layer covers part of the plurality of protruding structures.

In some embodiments, the at least one protruding structure has a first surface and a second surface opposite to each other, and a side face located between the first surface and the second surface. The portion of the display layer extending into the isolation region exposes a portion of the water-oxygen barrier pattern covering the side face.

In some embodiments, the first surface is farther away from the substrate than the second surface, and an area of the first surface is greater than an area of the second surface.

In some embodiments, an included angle between the first surface and the side face is within a range of 30° to 90°.

In some embodiments, the first surface is farther away from the substrate than the second surface. The first surface is an arc surface closer to the substrate than a center of a circle corresponding to the arc surface.

In some embodiments, the display layer includes: a light-emitting function layer and an electrode layer located on a side of the light-emitting function layer away from the substrate. The portion of the display layer extending into the isolation region includes: at least one of a portion of the light-emitting function layer that extends into the isolation region and is located on the side of the water-oxygen barrier pattern away from the substrate, and a portion of the electrode layer that extends into the isolation region and is located on the side of the water-oxygen barrier pattern away from the substrate.

In some embodiments, the display substrate further includes a carrier layer disposed on a side of the at least one protruding structure facing the substrate. The carrier layer is in direct contact with the at least one protruding structure, and both a material of the carrier layer and a material of the at least one protruding structure include organic materials.

In some embodiments, a material of the water-oxygen barrier pattern includes at least one of an inorganic material, a metal oxide, and a metal material.

In another aspect, a method of manufacturing a display substrate is provided, which includes:

providing a substrate, and the substrate having a display area, a preset opening region located in the display area, and an isolation region disposed around the preset opening region;

forming at least one protruding structure in the isolation region on the substrate;

forming a water-oxygen barrier pattern covering the at least one protruding structure in the isolation region;

forming a display layer in the display area, the preset opening region, and the isolation region, and the portion of the display layer located in the isolation region being located on a side of the water-oxygen barrier pattern away from the substrate; and removing the preset opening region of the substrate and the portion of the display layer located in the preset opening region, so as to form an opening surrounded by the isolation region.

In yet another aspect, a display apparatus is provided. The display apparatus includes the display substrates described in any of the above embodiments and at least one additional component. The at least one additional component are arranged in the opening of the display substrate.

In some embodiments, the at least one additional component includes at least one of a camera, an earpiece, a sensor, a physical key, and a pointer axis.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, and an actual process of a method to which the embodiments of the present disclosure relate.

DETAILED DESCRIPTION

Figure 1:
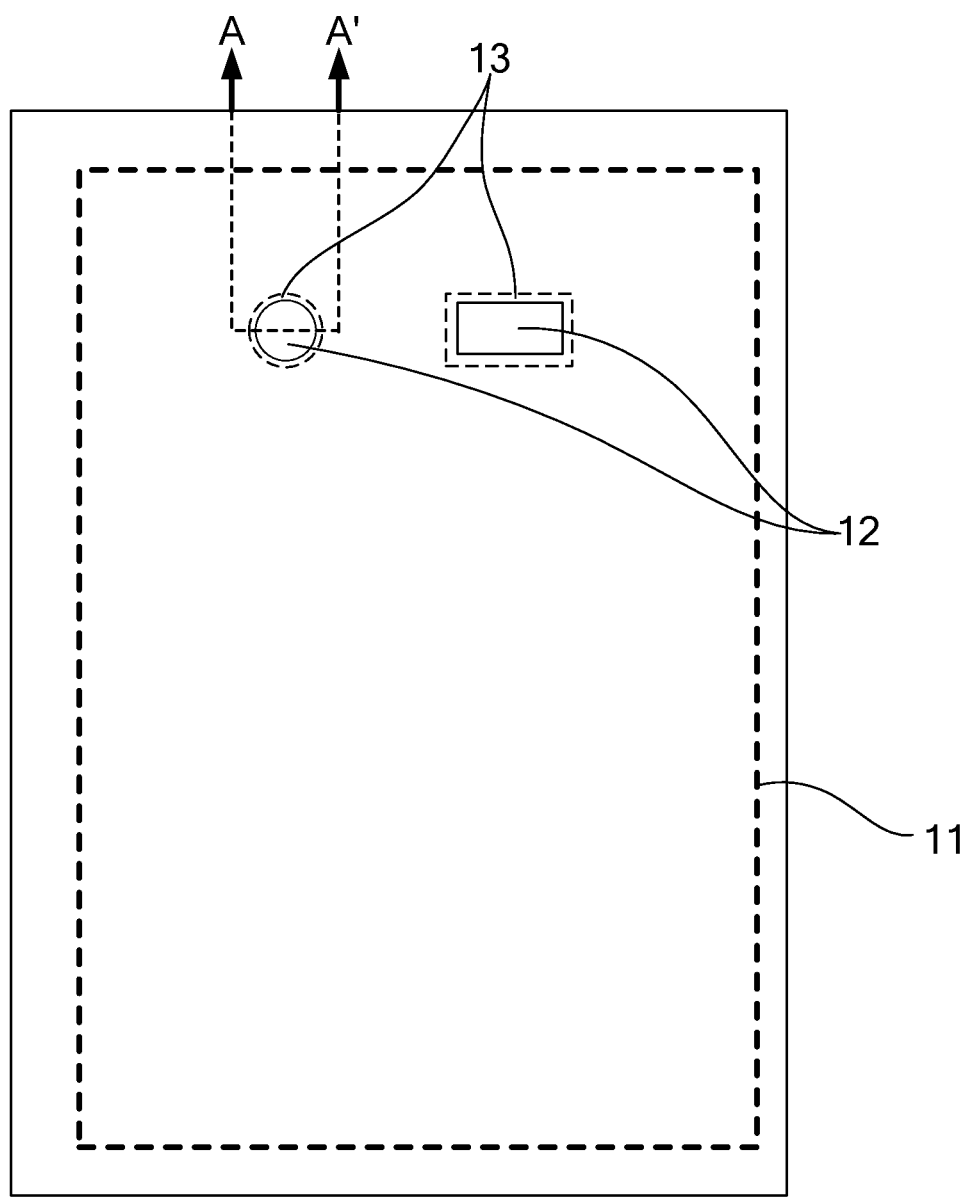
FIG. 1 is a structural diagram of a substrate in a display substrate, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or to characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" and "second" may explicitly or implicitly include one or more of the features. As used in this specification and the appended claims, the singular forms "a/an" and "the" may also include plural referents unless the content clearly dictates otherwise. In the description of the embodiments of the present disclosure, the term "a/the plurality of" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Since the OLED display substrate has self-luminous characteristics, it does not require liquid crystal and a backlight module, which is conducive to processing (e.g., cutting) the OLED display substrate to obtain a special-shaped display substrate, thereby meeting the needs of users for diversified displays.

For example, the OLED display substrate is applied to a full-screen display apparatus. In some application scenarios, the OLED display substrate needs to be provided with an opening penetrating therethrough to accommodate additional components or to meet the requirements of decorative design. For example, the display apparatus is a full-screen mobile phone, and at least one of structures such as an earphone, a camera, a sensor (e.g., a photoelectric sensor), a physical key (e.g., a key for fingerprint recognition) in the mobile phone is arranged in the opening. For another example, the display apparatus is a smart wearable device, such as a smart watch, and a pointer shaft in the watch is arranged in the opening.

Generally, water vapor and oxygen in the environment (i.e., water-oxygen) easily enter the interior of the display substrate through the opening of the display substrate, which affects the service life of internal devices of the display substrate, thereby affecting the display effect.

Based on this, as shown in FIGS. 1 to 12, some embodiments of the present disclosure provide a display substrate 1. The display substrate 1 includes a substrate 10, and at least one protruding structure 20, a water-oxygen barrier pattern 21, and a display layer 14 that are disposed on the substrate 10. The substrate 10 has a display area 11, opening(s) 12 located in the display area 11, and isolation region(s) 13 each disposed around an opening 12. The at least one protruding structure 20 is located in the isolation region(s) 13. The water-oxygen barrier pattern 21 covers the at least one protruding structure 20 and is located in the isolation region(s) 13. A portion of the display layer 14 is located in the display area 11, and a remaining portion of the display layer 14 extends into the isolation region(s) 13 and is located on a side of the water-oxygen barrier pattern 21 away from the substrate 10.

Figure 2:
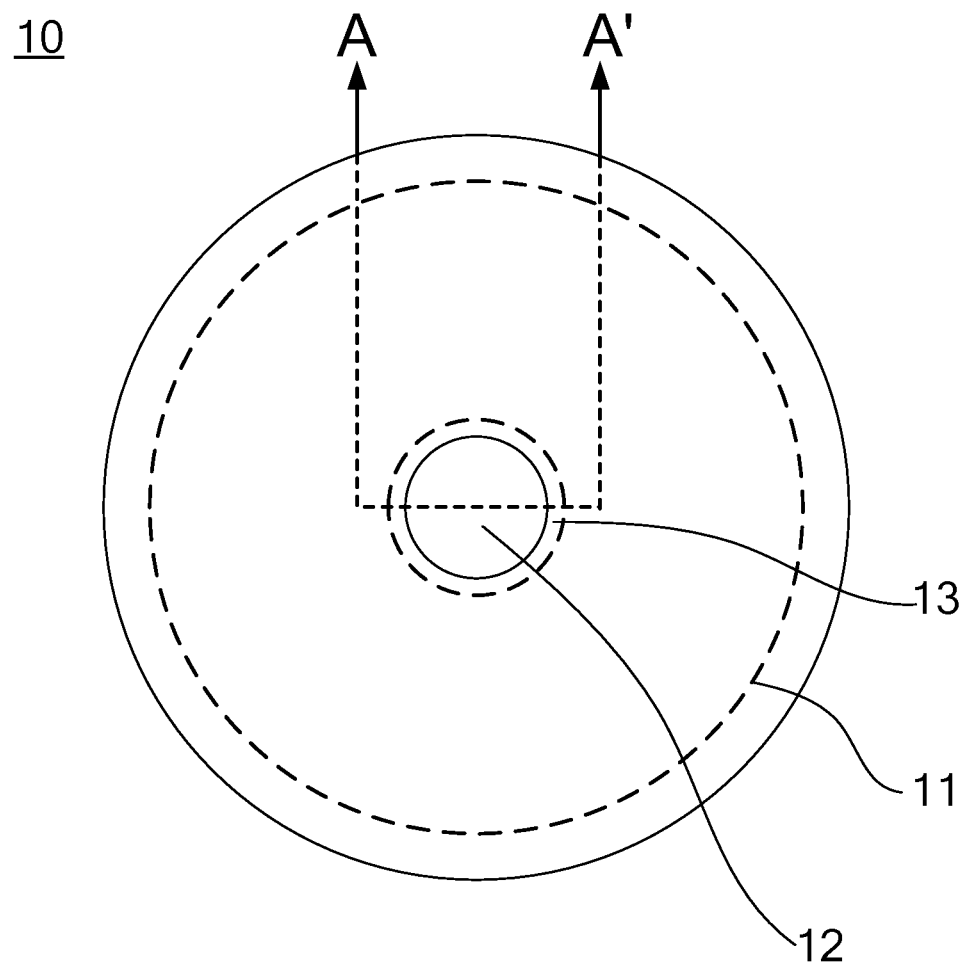
FIG. 2 is a structural diagram of a substrate in another display substrate, in accordance with some embodiments.
Figure 3:
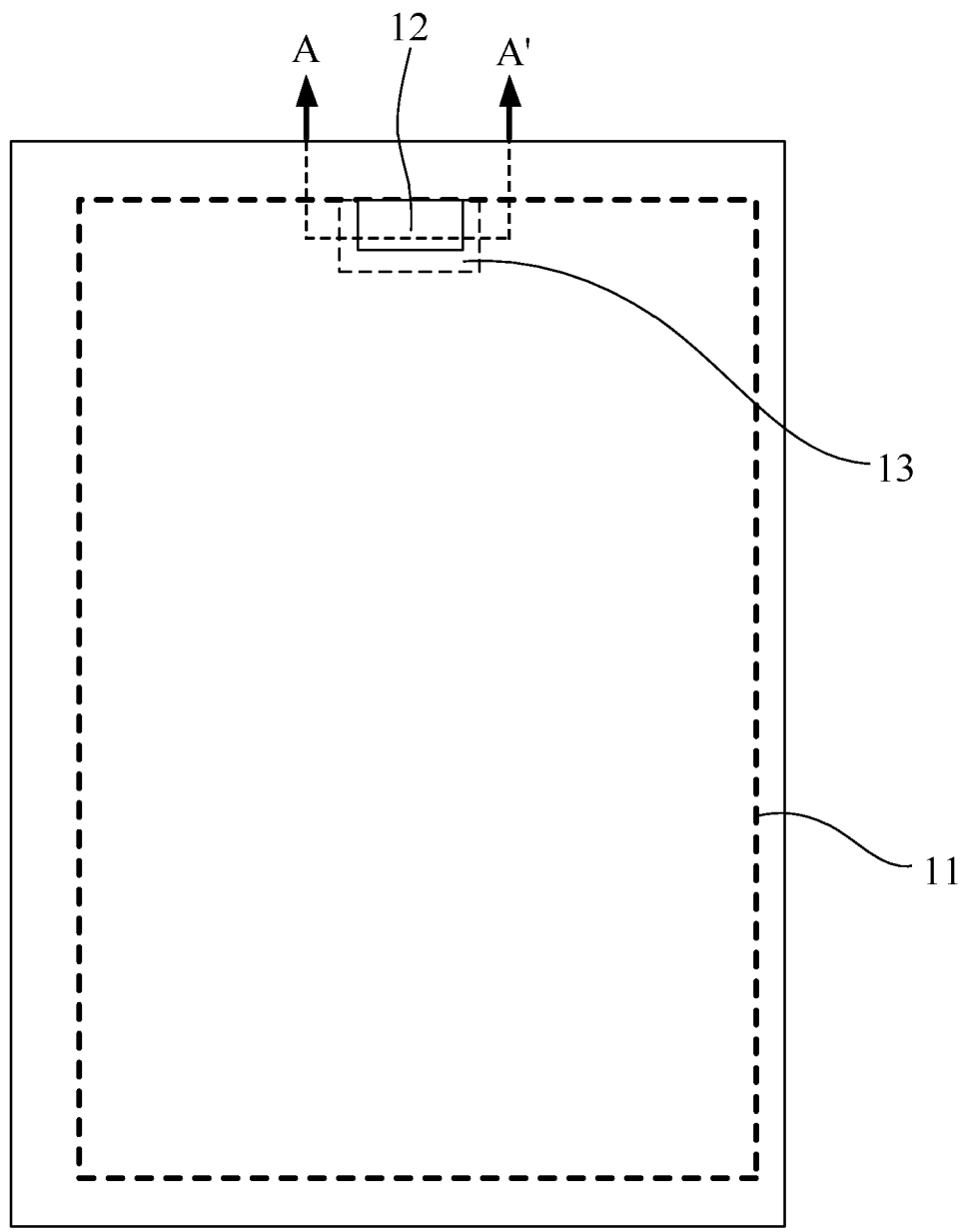
FIG. 3 is a structural diagram of a substrate in yet another display substrate, in accordance with some embodiments.
Figure 4:
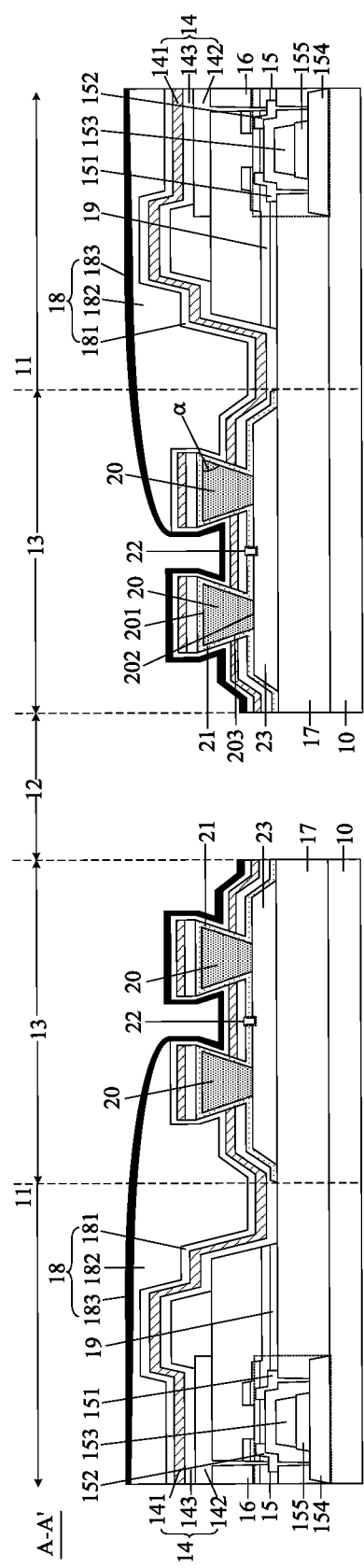
FIG. 4 is a section of a display substrate including the substrate shown in any one of FIGS. 1 to 3 along the A-A' direction, in accordance with some embodiments.

FIGS. 1 to 3 are structural diagrams of substrates in display substrates, in accordance with some embodiments. FIG. 4 is a section of a display substrate including the substrate shown in any one of FIGS. 1 to 3 along the A-A' direction, in accordance with some embodiments.

As shown in FIGS. 1 to 4, some embodiments provide a display substrate 1. The display substrate 1 includes a substrate 10, and at least one protruding structure 20, a water-oxygen barrier pattern 21, and a display layer 14 that are disposed on the substrate 10.

As shown in FIGS. 1 to 3, the substrate 10 has a display area 11, opening(s) 12 located in the display area 11, and isolation region(s) 13 each disposed around an opening 12.

As shown in FIG. 4, the at least one protruding structure 20 is located in the isolation region 13, and the water-oxygen barrier pattern 21 covers the at least one protruding structure 20 and is located in the isolation region 13. A portion of the display layer 14 is located in the display area 11 and is used for displaying images. A remaining portion of the display layer 14 extends into the isolation region 13 and is located on a side of the water-oxygen barrier pattern 21 away from the substrate 10. That is, the display layer 14 covers part of the water-oxygen barrier pattern 21.

The substrate 10 may be made of a flexible or rigid material, which is not limited in the embodiments of the present disclosure. It can be understood that, the opening 12 refers to a through hole that penetrates the substrate 10. In a plane parallel to a surface of the substrate 10, a section (hereinafter referred to as a cross section) of the opening 12 may be of various shapes, such as a rectangle (as shown in FIG. 1 or FIG. 3) or a circle (as shown in FIG. 1 or FIG. 2), which is not limited in the embodiments of the present disclosure.

In some embodiments, as shown in FIGS. 1 and 2, the opening 12 is located in the display area 11 and is not in contact with an internal border of the display area 11. That is, there is a gap between the border of the display area 11 and the opening 12.

In some other embodiments, as shown in FIG. 3, the opening 12 is located in the display area 11 and partially coincides with an external border of the display area 11. That is, the opening 12 is arranged at the external border of the display area 11. In this case, the isolation region 13 disposed around the opening 12 that is located at the external border of the display area 11 also partially coincides with the external border of the display area 11.

There may be one or more openings 12 in the display substrate 1, which is not limited in the embodiments of the present disclosure.

In some embodiments, as shown in FIGS. 2 and 3, the substrate 10 has an opening 12, and an isolation region 13 surrounding the opening 12.

In some other embodiments, as shown in FIG. 1, the substrate 10 has a plurality of openings 12 (e.g., two openings 12 with different cross sections) and a plurality of isolation regions 13. Each opening 12 is surrounded by a respective one of the plurality of isolation regions 13, and each isolation region 13 is provided with at least one protruding structure 20 therein.

It will also be understood that, "A disposed around B" appears multiple times in this text, for example, "the isolation region 13 disposed around the opening 12", etc., which means that A is at the periphery of B. That is, there may be other structure(s) between A and B, or A is in direct contact with B, and there is no other structure between A and B.

The protruding structure 20 may be in direct contact with the substrate 10, or there may be other structure(s) (such as a buffer layer) between the protruding structure 20 and the substrate 10, which is not limited herein.

In some embodiments, the protruding structure 20 is made of an organic material. For example, the protruding structure 20 is made of a positive or negative photoresist material, which facilitates the fabrication of the specific structure of the protruding structure 20 through a photolithography process.

In some embodiments, a material of the water-oxygen barrier pattern 21 includes at least one of inorganic materials with water-oxygen barrier properties (e.g., silicon nitride, silicon oxide, and silicon oxynitride), metal oxides (e.g., aluminum oxide, zinc oxide, and magnesium oxide), and metal materials (e.g., aluminum, titanium, chromium, molybdenum, copper, gold, and platinum). The water-oxygen barrier pattern 21, which can completely cover the protruding structure 20, can be fabricated through processes with good step coverage such as magnetron sputtering, chemical vapor deposition (CVD), or atomic layer deposition (ALD).

Generally, in the display substrate 1, corresponding film layers are formed on the complete substrate 10 firstly, and then a partial region of the substrate 10 (i.e., a preset opening region) is removed through processes such as punching to form the opening 12 of the substrate 10. When fabricating the display layer 14 in the display area 11, some of film layers in the display layer 14 are formed through evaporation processes using an open mask. An opening region of the open mask covers the display area 11, the isolation region 13, and the preset opening region corresponding to the opening 12 that is to be formed. Therefore, materials forming the above film layers will also be deposited in the isolation region 13 and the preset opening region.

In this way, when removing the preset opening region of the complete substrate 10, the material deposited in the preset opening region will also be removed. Based on this, in the display substrate 1 provided by the embodiments of the present disclosure, at least one protruding structure 20 is provided in the isolation region 13 surrounding the opening 12, and the protruding structure 20 is covered by the water-oxygen barrier pattern 21 which is utilized to isolate water and oxygen. Moreover, since the portion of the display layer 14 extending into the isolation region 13 is located on the side of the water-oxygen barrier pattern 21 away from the substrate 10, a position of the portion relative to the substrate 10 is elevated. Therefore, a path where components such as water and oxygen in the external environment enter the display area 11 from a cut surface of the opening 12 may be extended, which reduces a risk of water and oxygen entering the inside of the display substrate 1 from the cut surface of the opening, and improves the production yield of the display substrate 1.

Figure 6A:
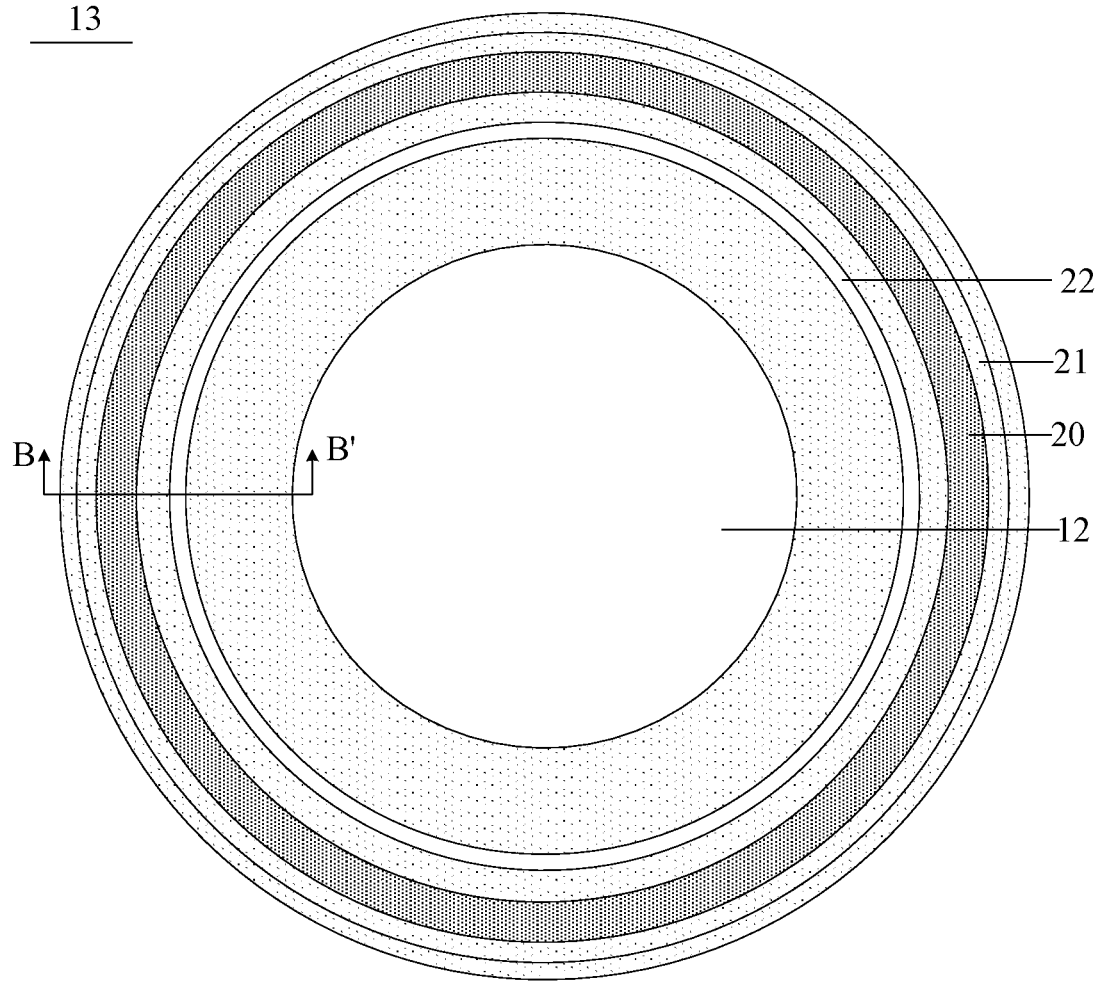
FIG. 6A is a top view of an isolation region in a display substrate, in accordance with some embodiments.

In some embodiments, as shown in FIG. 6A, the at least one protruding structure 20 includes one protruding structure 20 surrounding the opening 12. Here, the protruding structure 20 surrounding the opening 12 should be understood as that the protruding structure 20 is at the periphery of the opening 12, and there may or may not be other structures between the protruding structure 20 and the opening 12, which is not limited here.

In the plane parallel to the surface of the substrate 10, a shape of a section (hereinafter referred to as a cross section) of the protruding structure 20 may be similar to a shape of the cross section of the opening 12. For example, as shown in FIG. 1, in a case where a shape of a cross section of an opening 12 is a circle, a shape of a cross section of a protruding structure 20 corresponding to the opening 12 is a circular ring. In a case where a shape of a cross section of another opening 12 is a rectangle, a shape of a cross section of a protruding structure 20 corresponding to the opening 12 is a rectangular ring. In a case where the cross section of the opening 12 is of other shapes, such as an ellipse, or a triangle, a shape of a cross section of a protruding structure 20 corresponding to the opening 12 may also be a ring with a corresponding shape, which will not be repeated here.

Hereinafter, the shape of the protruding structure 20 is schematically illustrated by considering an example in which the shape of the cross section of the opening 12 is a circle.

FIG. 6A is a top view of an isolation region in the display substrate, in accordance with some embodiments. In some embodiments, as shown in FIG. 6A, the protruding structure 20 may be of a continuous circular ring-shaped structure.

Figure 6B:
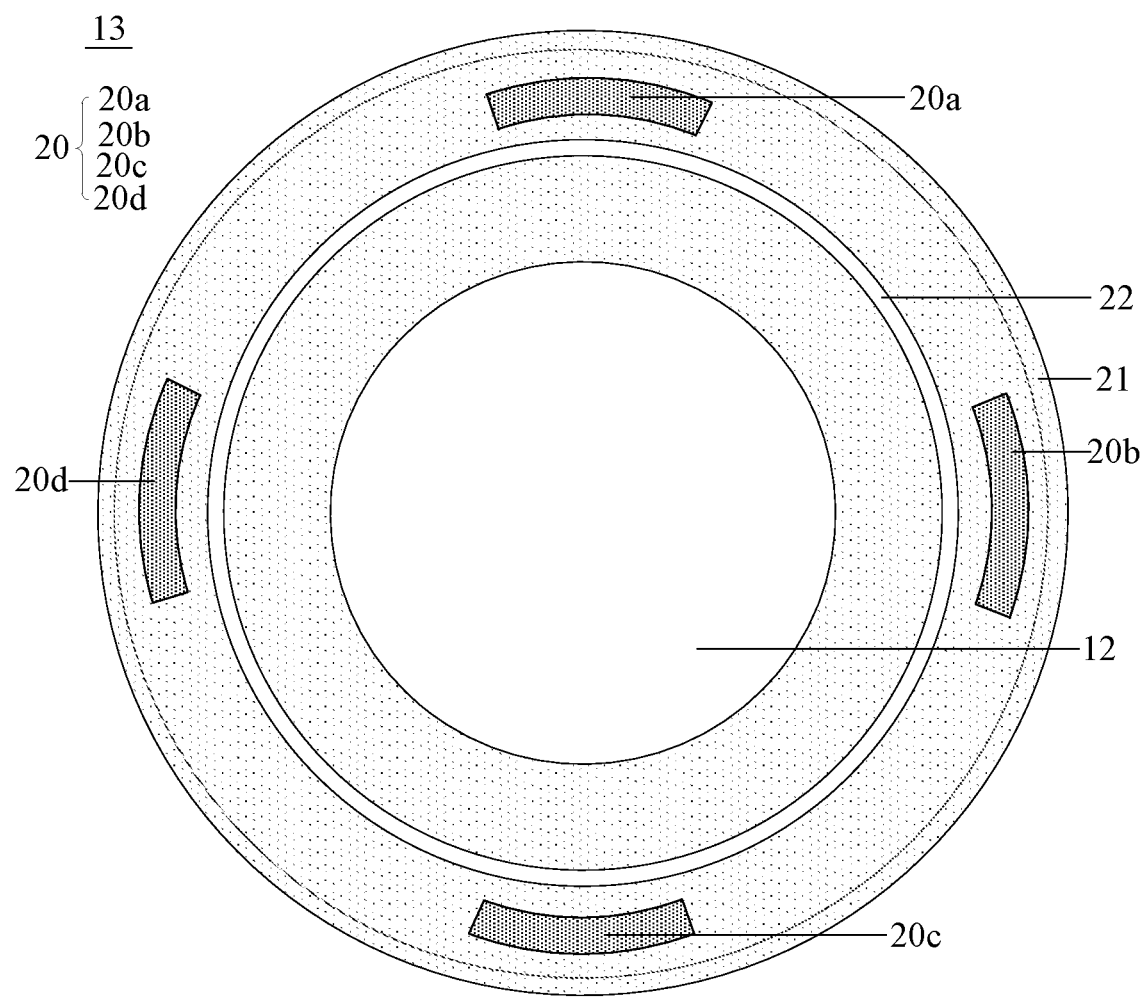
FIG. 6B is a top view of another isolation region in a display substrate, in accordance with some embodiments.

FIG. 6B is a top view of another isolation region in the display substrate, in accordance with some embodiments. In some other embodiments, as shown in FIG. 6B, the protruding structure 20 may include a plurality of separated sub-protruding structures 20a, 20b, 20c, and 20d.

Figure 7A:
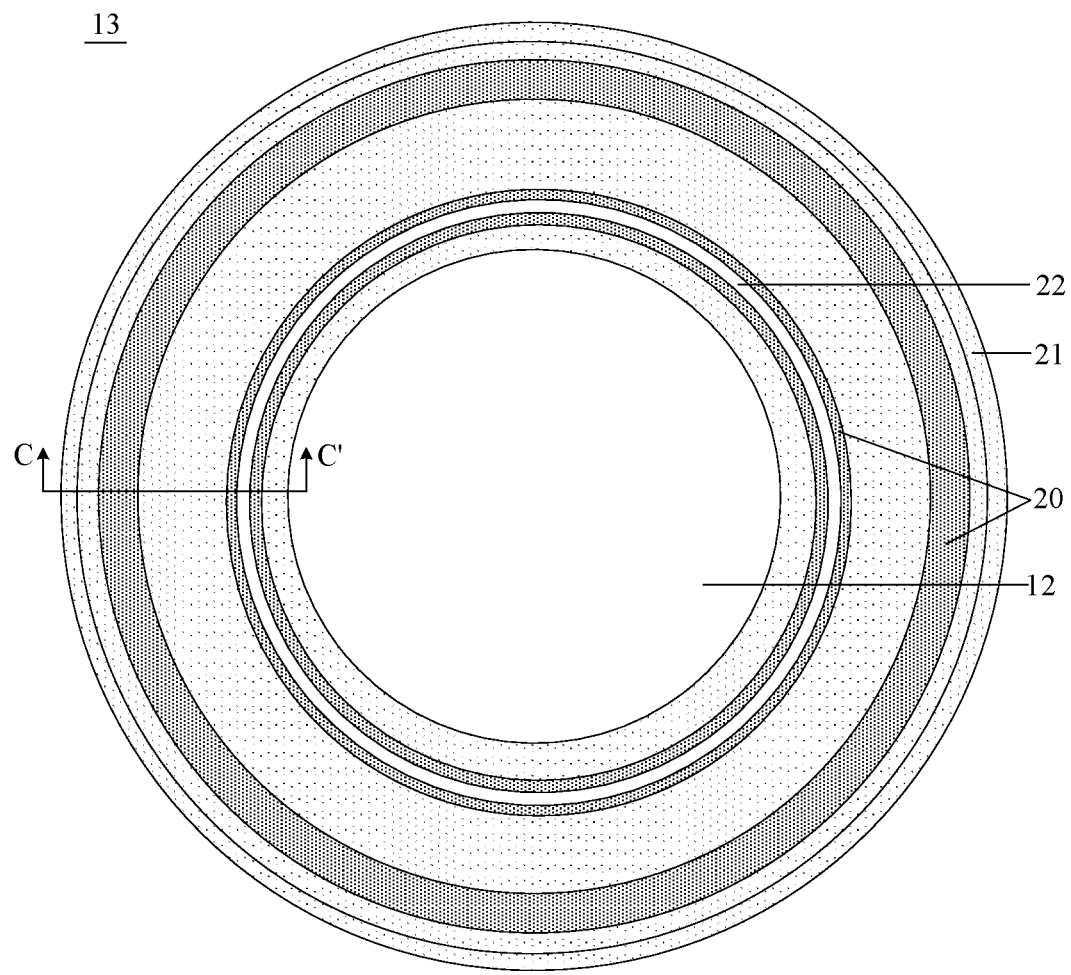
FIG. 7A is a top view of yet another isolation region in a display substrate, in accordance with some embodiments.
Figure 7B:
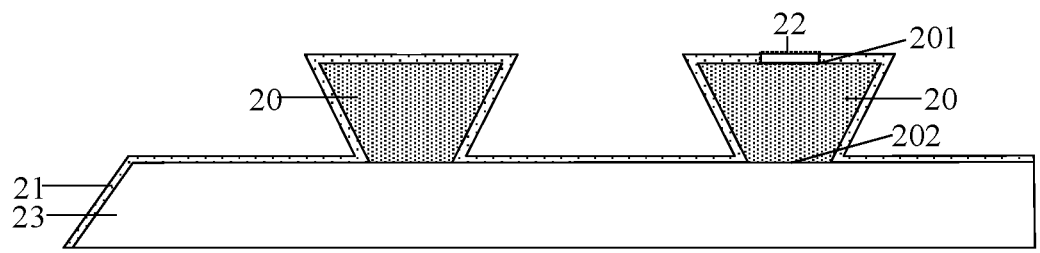
FIG. 7B is a section of the isolation region shown in FIG. 7A along the C-C' direction.

FIG. 7A is a top view of yet another isolation region in the display substrate, in accordance with some embodiments. FIG. 7B is a section of the isolation region shown in FIG. 7A along the C-C' direction. In some embodiments, as shown in FIGS. 7A and 7B, the at least one protruding structure 20 includes a plurality of protruding structures 20 that surround the opening 12 from the inside to the outside. For example, two to fifty protruding structures 20 may be provided, which is not limited here.

It will be understood that, the term "from the inside to the outside" refers to a direction from the center of the opening 12 to the border of the opening 12.

It will be noted that, an arrangement of any one of the plurality of protruding structures 20 is similar to an arrangement of the above one protruding structure 20. That is, in some examples, any one of the plurality of protruding structures 20 may be of a continuous structure. In some other examples, any one of the plurality of protruding structures 20 includes a plurality of separated sub-protruding structures, which will not be repeated here.

On the basis, since some of the film layers in the display layer 14 are formed through high-temperature processes, in a case where the protruding structure 20 is made of an organic material, the protruding structure 20 may release gas due to the subsequent to high-temperature process. Therefore, as shown in FIG. 4, the water-oxygen barrier pattern 21 has at least one through hole 22 penetrating itself in its own thickness direction, so as to connect the space at a side of the water-oxygen barrier pattern 21 facing the substrate 10 and the space at a side of the water-oxygen barrier pattern 21 facing away from the substrate 10. In this way, when the protruding structure 20 releases the gas due to the high temperature, the gas may be released through the through hole 22 in the water-oxygen barrier pattern 21. As a result, it is avoided that the gas cannot be released and enters other film layers, which in turn causes these other film layers to have blistering, film unevenness, and reduced film layer adhesion.

In order to facilitate the release of the gas, the through hole 22 may be provided on a side of the protruding structure 20 proximate to the opening 12. Hereinafter, a relative positional relationship between the protruding structure 20 and the through hole 22 is schematically illustrated by considering an example in which the shape of the cross section of the opening 12 is a circle.

Figure 6C:
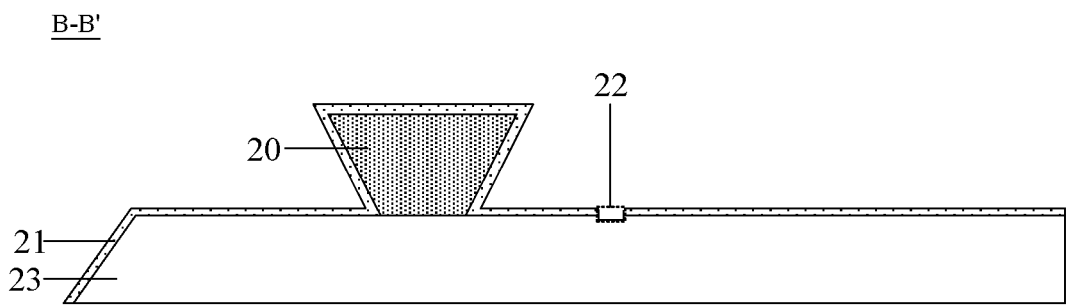
FIG. 6C is a section of the isolation region shown in FIG. 6A along the B-B' direction.

FIG. 6C is a section of the isolation region shown in FIG. 6A along the B-B' direction. In some embodiments, as shown in FIG. 6C, an orthogonal projection of the at least one through hole 22 on the substrate 10 is closer to the opening 12 than an orthogonal projection of the protruding structure 20 on the substrate 10. That is, the orthogonal projection of the through hole 22 on the substrate 10 is closer to the opening 12. Moreover, the orthogonal projection of the through hole 22 on the substrate 10 does not overlap with the orthogonal projection of the protruding structure 20 on the substrate 10. In this way, the gas released by the protruding structure 20 will be discharged through the through hole 22. Since the through hole 22 is proximate to the opening 12 (i.e., away from the display area 11), the discharged gas is prevented from entering the display area 11.

In some embodiments, the at least one protruding structure 20 includes a plurality of protruding structures 20 that surround the opening 12 from the inside to the outside. As shown in FIGS. 7A and 7B, the at least one protruding structure 20 includes two protruding structures 20.

In order to prevent the gas discharged through the through holes 22 from entering the display area 11, as shown in FIG. 7B, the orthogonal projection of the at least one through hole 22 on the substrate 10 is closer to the opening 12 than an orthogonal projection of an outermost one of the plurality of protruding structures 20 on the substrate 10. That is, the orthogonal projection of the through hole 22 on the substrate 10 is closer to the opening 12. Moreover, the orthogonal projection of the through hole 22 on the substrate 10 does not overlap with the orthogonal projection of the outermost one of the plurality of protruding structures 20 (i.e., a protruding structure 20 furthest from the opening 12) on the substrate 10. In this way, the gas released by the protruding structure 20 will be discharged through the through hole 22. Since the through hole 22 is proximate to the opening 12 (i.e., away from the display area 11), the gas discharged through the through hole 22 is prevented from entering the display area 11.

Figure 8A:
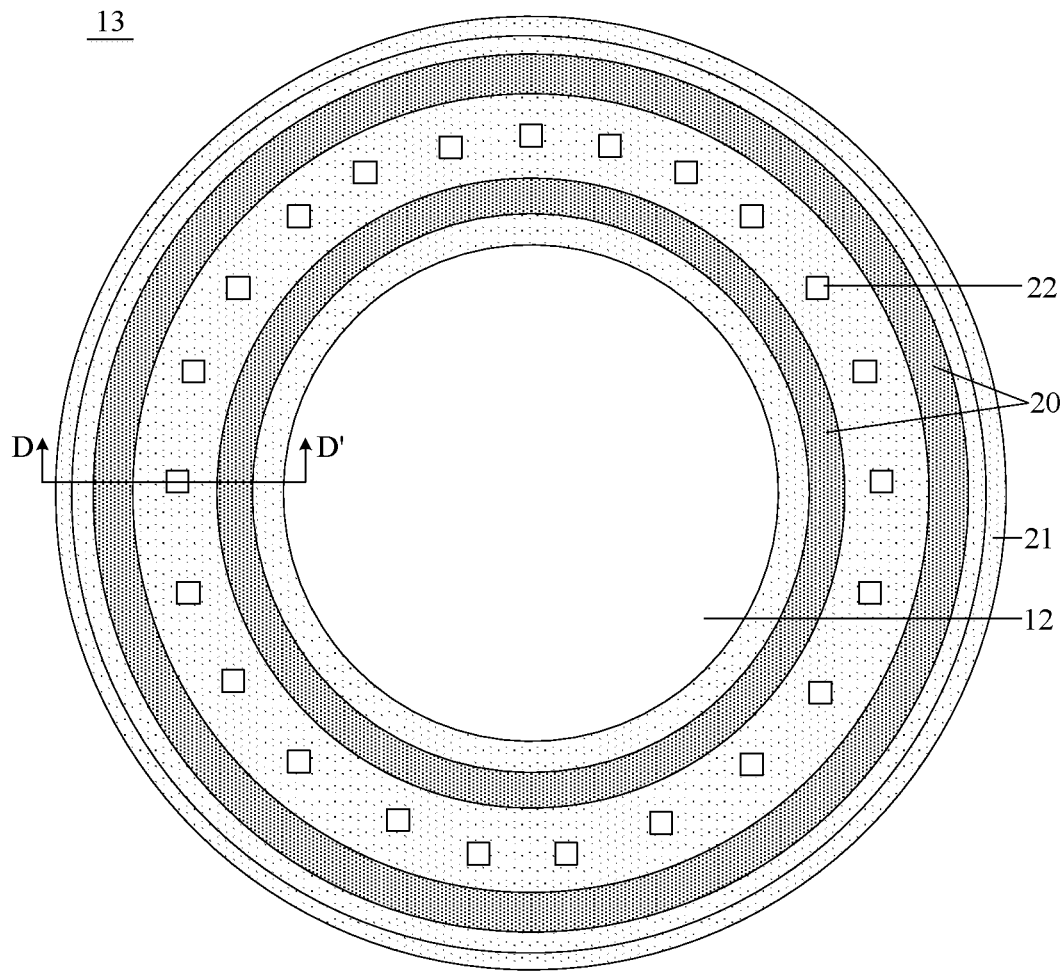
FIG. 8A is a top view of yet another isolation region in a display substrate, in accordance with some embodiments.
Figure 8B:
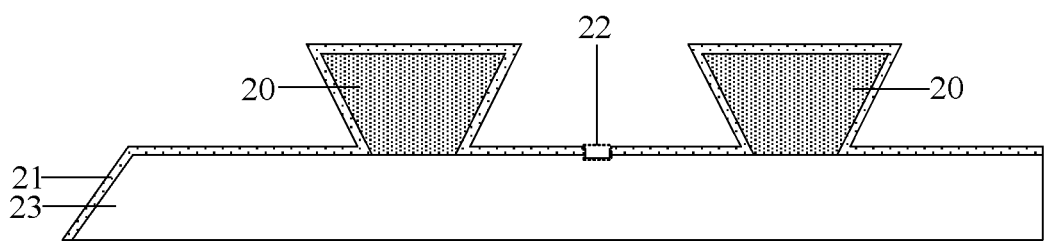
FIG. 8B is a section of the isolation region shown in FIG. 8A along the D-D' direction.

FIG. 8A is a top view of yet another isolation region in the display substrate, in accordance with some embodiments. FIG. 8B is a section of the isolation region shown in FIG. 8A along the D-D' direction.

In some embodiments, as shown in FIGS. 8A and 8B, the at least one through hole 22 is located between two adjacent protruding structures 20 of the plurality of protruding structures 20, so that the gas released by the two adjacent protruding structures 20 may be discharged through the through hole 22.

In some embodiments, as shown in FIG. 7B, the at least one protruding structure 20 has a first surface 201 and a second surface 202 opposite to each other, and the first surface 201 is farther away from the substrate 10 than the second surface 202. The at least one through hole 22 is located in a portion of the water-oxygen barrier pattern 21 opposite to the first surface 201, so that the gas released by the protruding structure 20 is more easily discharged through the through hole 22.

In some embodiments, as shown in FIG. 6A, the at least one through hole 22 includes a single through hole 22. The single through hole 22 is in a shape of a ring that surrounds the opening 12, such as a circular ring. Alternatively, the single through hole 22 may also be in a shape of a fan ring that partially surrounds the opening 12.

In some other examples, in a case where the opening 12 is disposed at the external border of the display area 11, the shape of the through hole 22 disposed around the opening 12 may be a fan ring, which is not limited here.

Figure 9A:
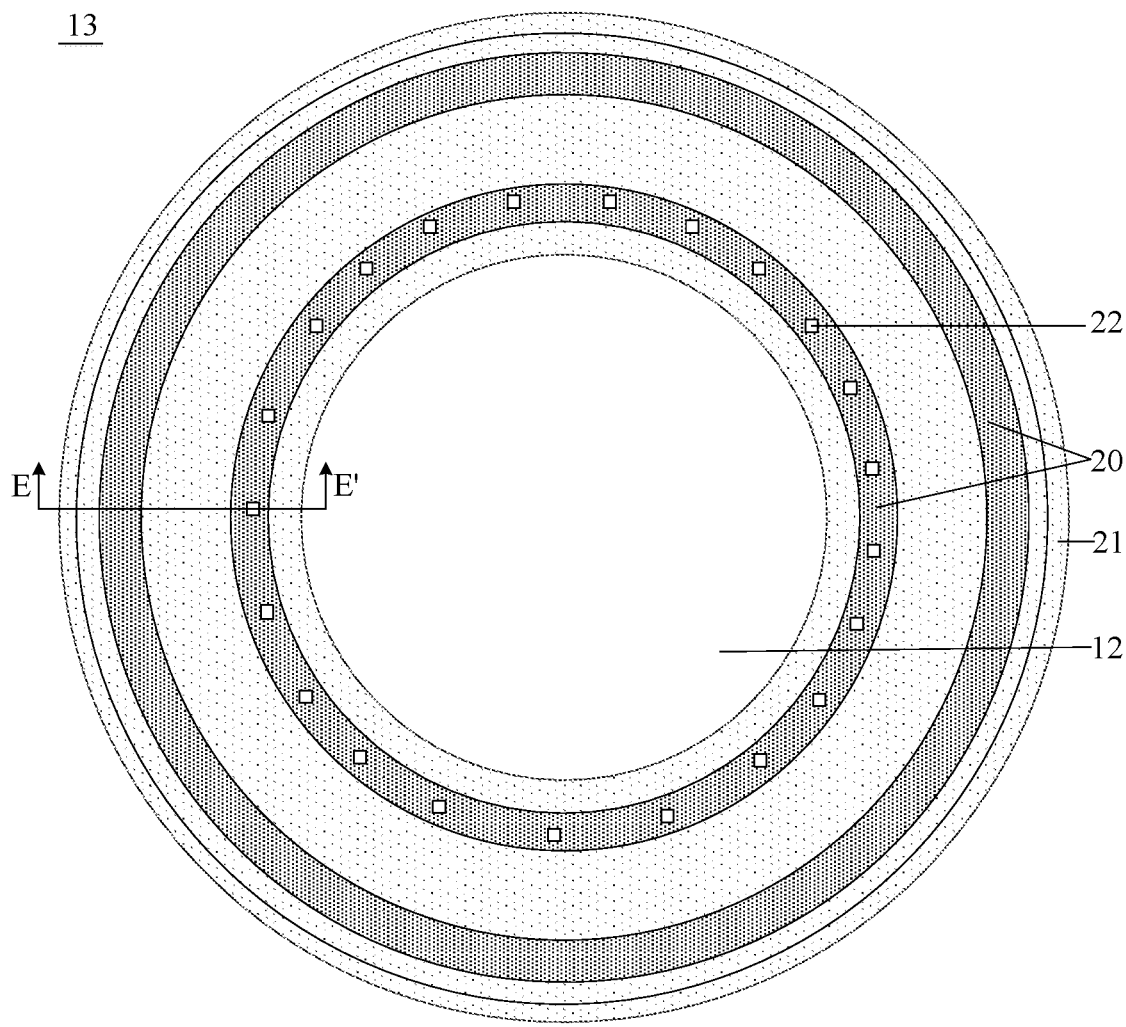
FIG. 9A is a top view of yet another isolation region in a display substrate, in accordance with some embodiments.

In some other embodiments, as shown in FIGS. 8A and 9A, the at least one through hole 22 includes a plurality of through holes 22, which are spaced around the opening 12, so that the gas released by the protruding structure 20 may be discharged through the through holes 22 located at multiple positions.

Figure 9B:
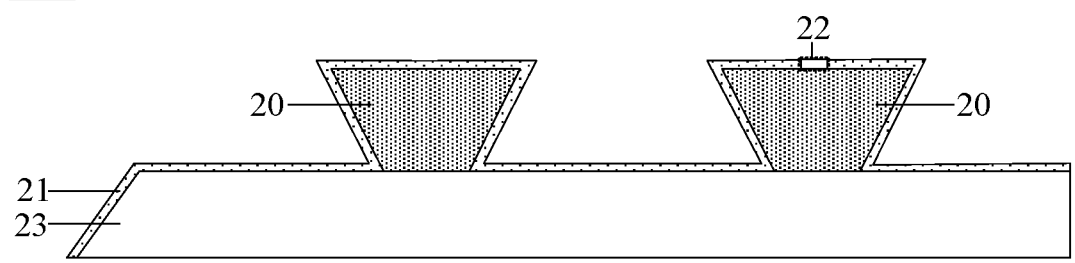
FIG. 9B is a section of the isolation region shown in FIG. 9A along the E-E' direction.
Figure 10A:
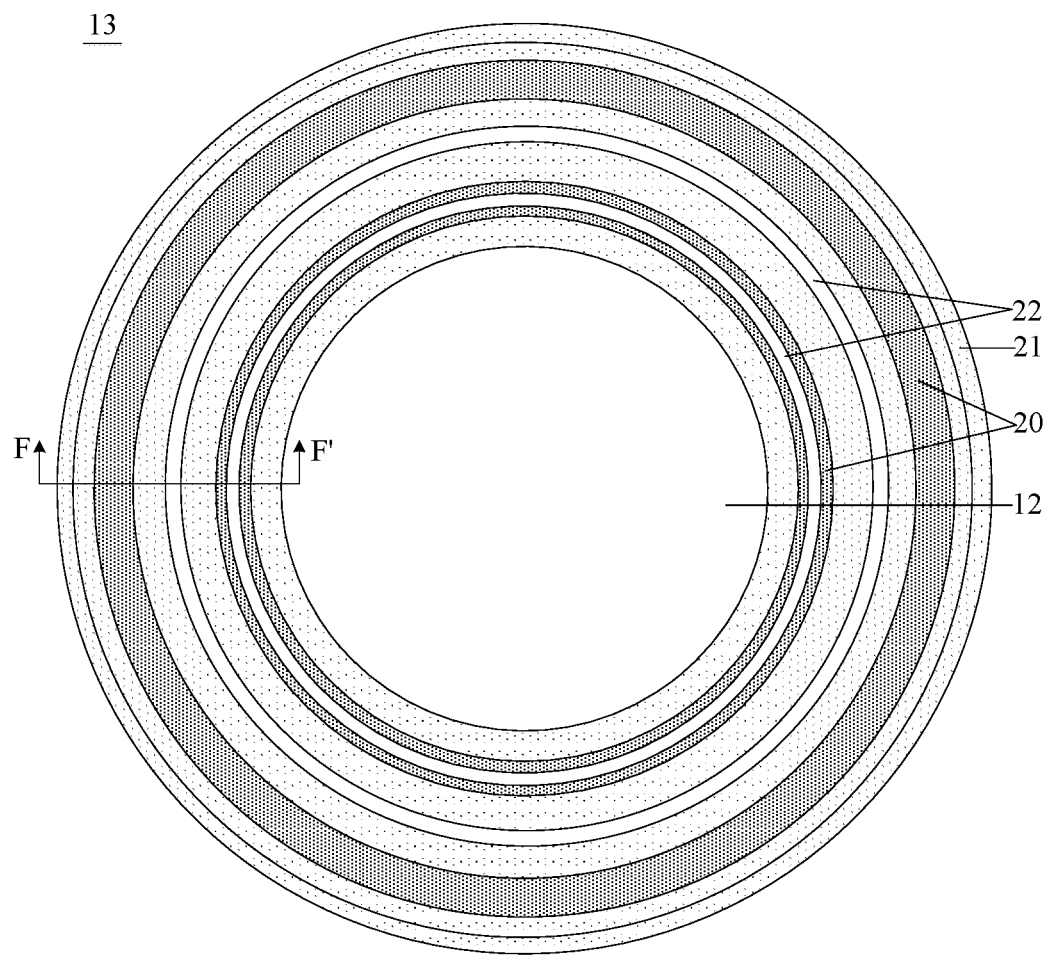
FIG. 10A is a top view of yet another isolation region in a display substrate, in accordance with some embodiments.
Figure 10B:
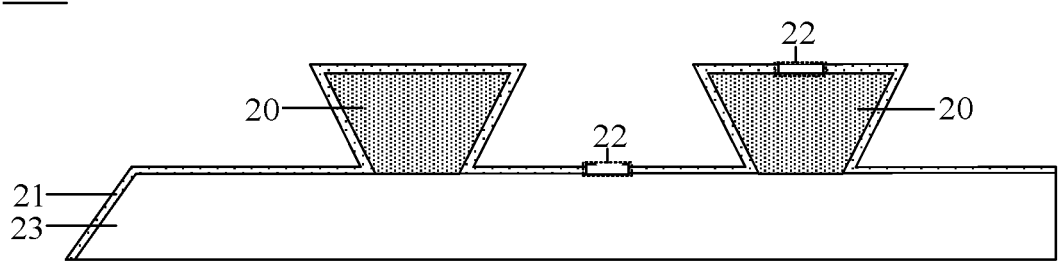
FIG. 10B is a section of the isolation region shown in FIG. 10A along an F-F' direction.

FIG. 9A is a top view of yet another isolation region in the display substrate, in accordance with some embodiments. FIG. 9B is a section of the isolation region shown in FIG. 9A along the E-E' direction. FIG. 10A is a top view of yet another isolation region in the display substrate, in accordance with some embodiments. FIG. 10B is a section of the isolation region shown in FIG. 10A along the F-F' direction.

In some embodiments, as shown in FIGS. 8A and 9A, the plurality of through holes 22 may be spaced in a way that the plurality of through holes 22 are spaced along a circumferential direction of the opening 12 to surround the opening 12. Here, the circumferential direction refers to a direction along the border of the opening 12. For example, the cross section of the opening 12 is in a shape of a circle, and the circumferential direction is a circumferential direction of the circle.

In some other embodiments, as shown in FIG. 10A, the plurality of through holes 22 may be spaced in a way that the plurality of through holes 22 are spaced along a radial direction of the opening 12. Of course, in this case, an arrangement of any one of the plurality of through holes 22 is similar to that of the above one through hole 22, which will not be repeated here.

In some embodiments, as shown in FIG. 4, the display layer 14 includes a light-emitting function layer 143, and an electrode layer that is located on a side of the light-emitting function layer 143 away from the substrate 10 (for convenience of distinction, the electrode layer here is referred to as a first electrode layer 141). The portion of the display layer 14 extending into the isolation region 13 includes at least one of a portion of the light-emitting function layer 143 that extends into the isolation region 13 and is located on the side of the water-oxygen barrier pattern 21 away from the substrate 10 and a portion of the first electrode layer 141 that extends into the isolation region 13 and is located on the side of the water-oxygen barrier pattern 21 away from the substrate 10.

Of course, the display layer 14 further includes a second electrode layer 142, and the second electrode layer 142 is located on a side of the light-emitting function layer 143 facing the substrate 10. The second electrode layer 142 includes a plurality of mutually independent second electrodes, and the second electrodes are electrically connected to pixel driving circuits. In this way, the first electrode layer 141, the light-emitting function layer 143, and the plurality of second electrodes can form a plurality of OLEDs.

The first electrode layer 141 is, for example, a cathode layer. Correspondingly, the second electrode layer 142 is an anode layer, and the plurality of second electrodes of the second electrode layer 142 are anodes.

In some examples, the first electrode layer 141 is a transmission electrode layer. Correspondingly, the second electrode layer 142 is a reflective electrode layer. In this case, the display layer 14 further includes an optical adjustment layer located on a side of the first electrode layer 141 facing away from the light-emitting function layer 143. The optical adjustment layer may also be referred to as a light extraction layer, and a material of the optical adjustment layer is usually an organic material with a large refractive index and a small light absorption coefficient, which can improve the light extraction efficiency of the OLED.

Figure 5:
FIG. 5 is a structural diagram of a light-emitting function layer in a display to substrate, in accordance with some embodiments.

FIG. 5 is a structural diagram of a light-emitting function layer in the display substrate, in accordance with some embodiments. In some embodiments, as shown in FIG. 5, the light-emitting function layer 143 includes at least one organic layer, and the at least one organic layer includes a light-emitting layer 1431. The at least one organic layer may include one or more of an electron injection layer (EIL) 1432, an electron transport layer (ETL) 1433, a hole blocking layer (HBL) 1434, an electron blocking layer (EBL) 1435, a hole transport layer (HTL) 1436, and a hole injection layer (HIL) 1437 in addition to the light-emitting layer 1431, which may increase the luminescence efficiency of the light-emitting function layer 143.

The display area 11 includes a plurality of sub-pixel regions, and the plurality of sub-pixel regions include sub-pixel regions of a first color, sub-pixel regions of a second color and sub-pixel regions of a third color. For example, the sub-pixel regions of the first color, the sub-pixel regions of the second color, and the sub-pixel regions of the third color are red sub-pixel regions, green sub-pixel regions, and blue sub-pixel regions, respectively. The distribution manners of the sub-pixel regions of the first color, the sub-pixel regions of the second color, and the sub-pixel regions of the third color may be referred to the conventional settings in the art.

In some examples, the light-emitting layer 1431 includes a plurality of light-emitting patterns located in sub-pixel regions of colors, so that portions of the light-emitting layer 1431 located in different sub-pixel regions display light of a corresponding color. In this case, the first electrode layer 141 and other functional layers such as the electron injection layer 1432 may each be a whole layer. That is, they cover the sub-pixel regions of each color, and are each formed through vapor deposition using an open mask.

In some other examples, the light-emitting layer 1431 is a whole layer and is configured to emit white light. The first electrode layer 141 and other functional layers such as the electron injection layer 1432 may also each be a whole layer. That is, they cover the sub-pixel regions of each color, and are each formed through vapor deposition using an open mask.

Each sub-pixel region is provided with a pixel driving circuit and a light-emitting function layer 143. Generally, the pixel driving circuit is composed of electronic devices such as thin film transistor(s) (TFT) and capacitor(s) (C). For example, the pixel driving circuit may be a pixel driving circuit of a 2T1C structure composed of two TFTs (a switching TFT and a driving TFT) and one capacitor. Of course, the pixel driving circuit may also be a pixel driving circuit composed of more than two TFTs (multiple switching TFTs and one driving TFT) and at least one capacitor. In these pixel driving circuits, there is a TFT that is electrically connected to the light-emitting function layer 143.

As shown in FIG. 4, the thin film transistor 15 includes a source 151, a drain 152, to a gate 153, an active pattern 154, and a gate insulation pattern 155. The drain 152 is electrically connected to the second electrode 142 through via holes in a planarization layer 16 and a passivation layer 19.

In some embodiments, as shown in FIG. 4, the display substrate 1 further includes a carrier layer 23 disposed on a side of the at least one protruding structure 20 facing the substrate 10, and the protruding structure 20 is in direct contact with the carrier layer 23. Both the material of the protruding structure 20 and the material of the carrier layer 23 include an organic material. The material of the protruding structure 20 and the material of the carrier layer 23 may be a same organic material or different organic materials, which is not limited here.

Since the adhesion between the organic material and the organic material is stronger than the adhesion between the organic material and the inorganic material, in a case where both the material of the protruding structure 20 and the material of the carrier layer 23 are organic materials, the adhesion between the protruding structure 20 and the carrier layer 23 is good, which can prevent cracking between the protruding structure 20 and a film layer directly in contact therewith (e.g., an interlayer insulating layer 17) made of other inorganic materials due to the poor adhesion between the organic material and the inorganic material when the protruding structure 20 is directly fabricated on the film layer.

It will be noted that, in some embodiments, as shown in FIG. 4, the carrier layer 23 is provided on the substrate 10. Since a material of the substrate 10 is generally an inorganic material, the adhesion between the carrier layer 23 and the substrate 10 may be low. However, due to a large contact area between the carrier layer 23 and the substrate 10, a phenomenon of cracks or dislocations will not be prone to occur between to the carrier layer 23 and the substrate 10.

In some embodiments, as shown in FIG. 4, the display substrate 1 further includes the planarization layer 16 disposed on a side of the display layer 14 facing the substrate 10. A material of the planarization layer 16 may be photo-sensitive polyimide. In some examples, the planarization layer 16 and the carrier layer 23 are arranged in a same layer, so that they may be formed in a same patterning process to simplify the manufacturing process.

The "same layer" mentioned herein refers to a layer structure formed by a film layer for forming specific patterns through a same film forming process and then by one patterning process using a same mask. Depending on the different specific patterns, the same patterning process may include several exposure, development or etching processes, and the specific patterns in the formed layer structure may be continuous or discontinuous, and these specific patterns may also be at different heights or have different thicknesses. In this way, the carrier layer 23 and the planarization layer 16 may be fabricated simultaneously, which is beneficial to simplify the manufacturing process of the display substrate.

In some embodiments, as shown in FIG. 4, the at least one protruding structure 20 has a first surface 201 and a second surface 202 opposite to each other, and a side face 203 located between the first surface 201 and the second surface 202. The portion of the display layer 14 extending into the isolation region 13 exposes a portion of the water-oxygen barrier pattern 21 covering the side face 203, so that the display layer 14 is separated at the protruding structure 20.

In some embodiments, as shown in FIG. 4, the first surface 201 is farther away from the substrate 10 than the second surface 202, and an area of the first surface 201 is greater than an area of the second surface 202, so that in a case where the display layer 14 that is located on a side of the protruding structure 20 away from the substrate 10 is fabricated, the portion of the display layer 14 extending into the isolation region 13 is prone to be separated at the side face 203 of the protruding structure 20.

In some embodiments, as shown in FIG. 4, an included angle between the first surface 201 and the side face 203 (i.e., the angle α in FIG. 4) is within a range of 30° to 90°. For example, the included angle between the first surface 201 and the side face 203 may be 30°, 45°, 60°, 75°, or 90°.

In this way, it may ensure that the area of the first surface 201 is greater than or equal to the area of the second surface 202, so as to separate the portion of the display layer 14 extending into the isolation region 13.

Figure 11:
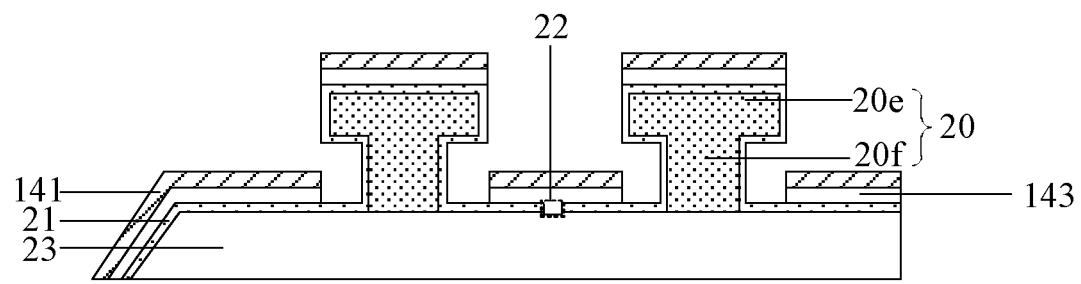
FIG. 11 is a structural diagram of a protruding structure in a display substrate, in to accordance with some embodiments.

FIG. 11 is a structural diagram of a protruding structure in the display substrate, in accordance with some embodiments. In some embodiments, as shown in FIG. 11, the shape of the protruding structure 20 may be a "T" shape. That is, the protruding structure 20 includes a first portion 20*e* and a second portion 20*f*, the first portion 20*e* is parallel to the substrate 10, the second portion 20*f* is perpendicular to the substrate 10, and both ends of the first portion 20*e* extend beyond the second portion 20*f* to form the "T" shape.

Figure 12:
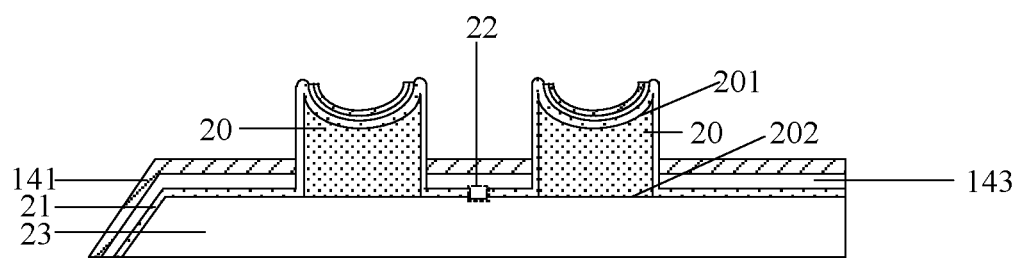
FIG. 12 is a structural diagram of another protruding structure in display substrate, in accordance with some embodiments.

FIG. 12 is a structural diagram of another protruding structure in the display substrate, in accordance with some embodiments. In some other embodiments, as shown in FIG. 12, the first surface 201 is farther away from the substrate 10 than the second surface 202, the first surface 201 is an arc surface, and the arc surface is closer to the substrate 10 than a center of a circle corresponding to the arc surface.

In some embodiments, as shown in FIG. 4, the display substrate 1 further includes a thin film encapsulation layer 18, which covers the display area 11 and the water-oxygen barrier pattern 21. The thin film encapsulation layer 18 includes a first inorganic sub-encapsulation layer 181, an organic sub-encapsulation layer 182, and a second inorganic sub-encapsulation layer 183 that are sequentially stacked in a thickness direction of the substrate 10, thereby preventing external water vapor and oxygen from entering the display area 11 and preventing the display layer 14 of the display area 11 from being damaged.

In some embodiments, as shown in FIG. 4, a border of a portion of the first inorganic sub-encapsulation layer 181 extending into the isolation region 13 and a border of a portion of the second inorganic sub-encapsulation layer 183 extending into the isolation region 13 are closer to the opening 12 than a border of a portion of the organic sub-encapsulation layer 182 extending into the isolation region 13.

In some embodiments, as shown in FIG. 4, the at least one protruding structure 20 includes a plurality of protruding structures 20 that—surround the opening 12 from the inside to the outside. The first inorganic sub-encapsulation layer 181 and the second inorganic sub-encapsulation layer 183 cover all the protruding structures 20, and the organic sub-encapsulation layer 182 covers part of the plurality of protruding structures 20 (i.e., protruding structure(s) 20 farther away from the opening 12).

In some embodiments, as shown in FIG. 4, the orthogonal projection of the through hole 22 on the substrate 10 is closer to the opening 12 than an orthogonal projection of the organic sub-encapsulation layer 182 on the substrate 10. That is, there is no overlap between the two orthogonal projections. Therefore, it may be possible to prevent the gas released by the protruding structure 20 from entering the organic sub-encapsulation layer 182 through the through hole 22, and then entering the display layer 14 of the display area 11, and thus prevent the display layer 14 from being damaged.

Generally, a material of the organic sub-encapsulation layer 182 includes, for example, at least one of polymethyl methacrylate (PMMA), polyethylene terephthalate (PET), and polyethylene naphthalate (PEN), polyimide (PI), polyvinyl chloride (PVC), and polytetrafluoroethylene (PTFE). Materials of the first inorganic sub-encapsulation layer 181 and the second inorganic sub-encapsulation layer 183 include at least one of inorganic insulating materials such as silicon nitride, silicon oxide, and aluminum oxide.

The first inorganic sub-encapsulation layer 181 and the second inorganic sub-encapsulation layer 183 have good water and oxygen barrier effects, and the organic sub-encapsulation layer 182 has good ductility and flexibility. Therefore, by arranging the organic sub-encapsulation layer 182 in the thin film encapsulation layer 18, it may be possible that the thin film encapsulation layer 18 has good ductility and flexibility. Meanwhile, the organic sub-encapsulation layer 182 also plays a role of planarization.

Figure 13:
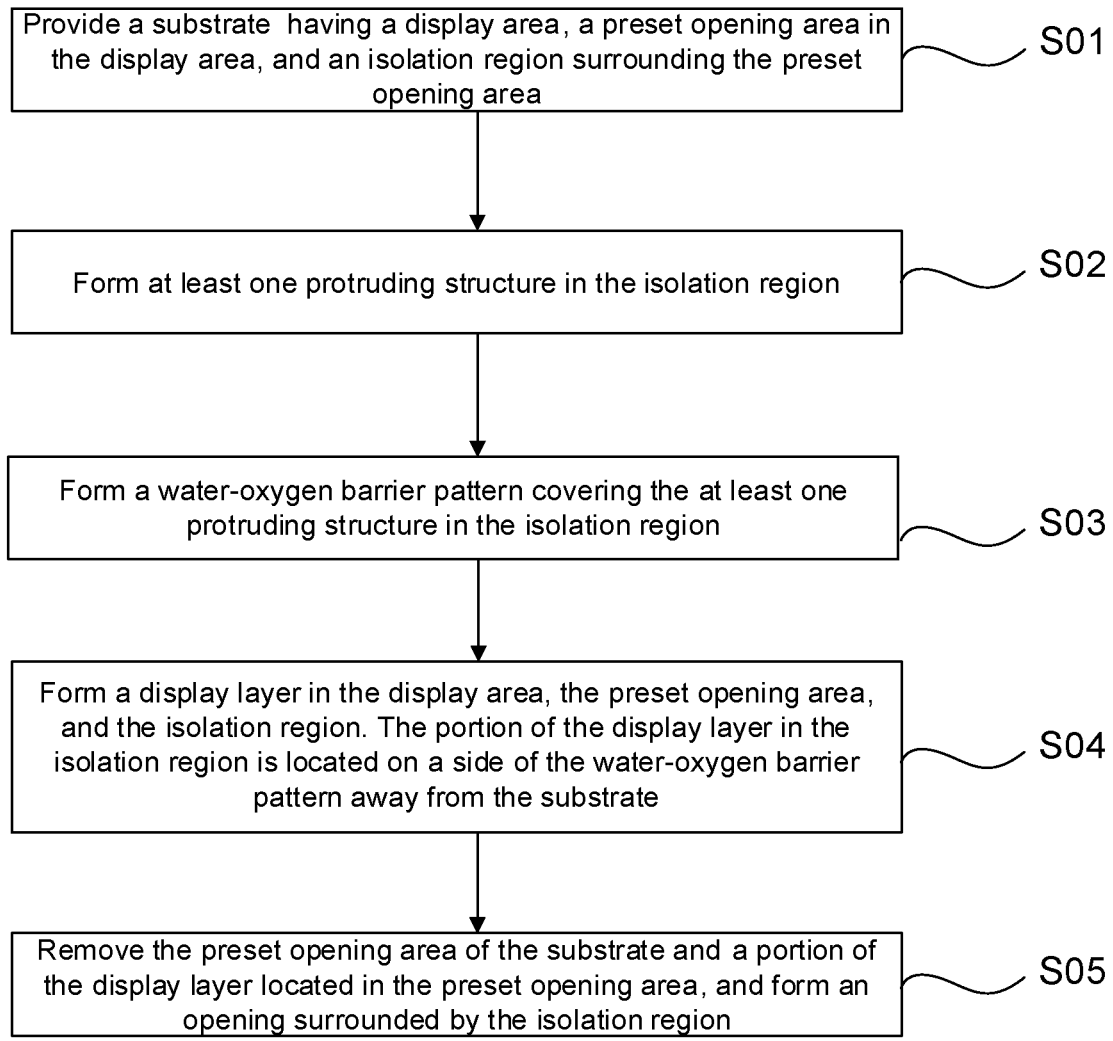
FIG. 13 is a flow diagram of a method of manufacturing a display substrate, in accordance with some embodiments.

In another aspect, some embodiments of the present disclosure provide a method of manufacturing the display substrate 1 in any of the above embodiments. FIG. 13 is a flow diagram of a method of manufacturing a display substrate, in accordance with some embodiments. As shown in FIG. 13, the manufacturing method includes the following steps S01 to S05.

In S01, a substrate 10 is provided. The substrate 10 has a display area 11, a preset opening region located in the display area 11, and an isolation region 13 disposed around the preset opening region.

In S02, at least one protruding structure 20 is formed in the isolation region 13.

A material of the protruding structure 20 may be photoresist, and a required shape of the protruding structure 20 is formed through a photolithography process.

In S03, a water-oxygen barrier pattern 21 covering the at least one protruding structure 20 is formed in the isolation region 13.

In S04, a display layer 14 is formed in the display area 11, the preset opening region, and the isolation region 13. The portion of the display layer 14 located in the isolation region 13 is located on a side of the water-oxygen barrier pattern 21 away from the substrate 10.

Generally, after the display layer 14 is fabricated, a thin film encapsulation layer 18 will also be fabricated, so as to prevent external water and oxygen from entering the display area 11.

In S05, the preset opening region of the substrate 10 and a portion of the display layer 14 located in the preset opening region are removed, so as to form an opening 12 surrounded by the isolation region 13.

In a possible implementation, a laser cutting process may be used to form the opening 12.

Figure 14:
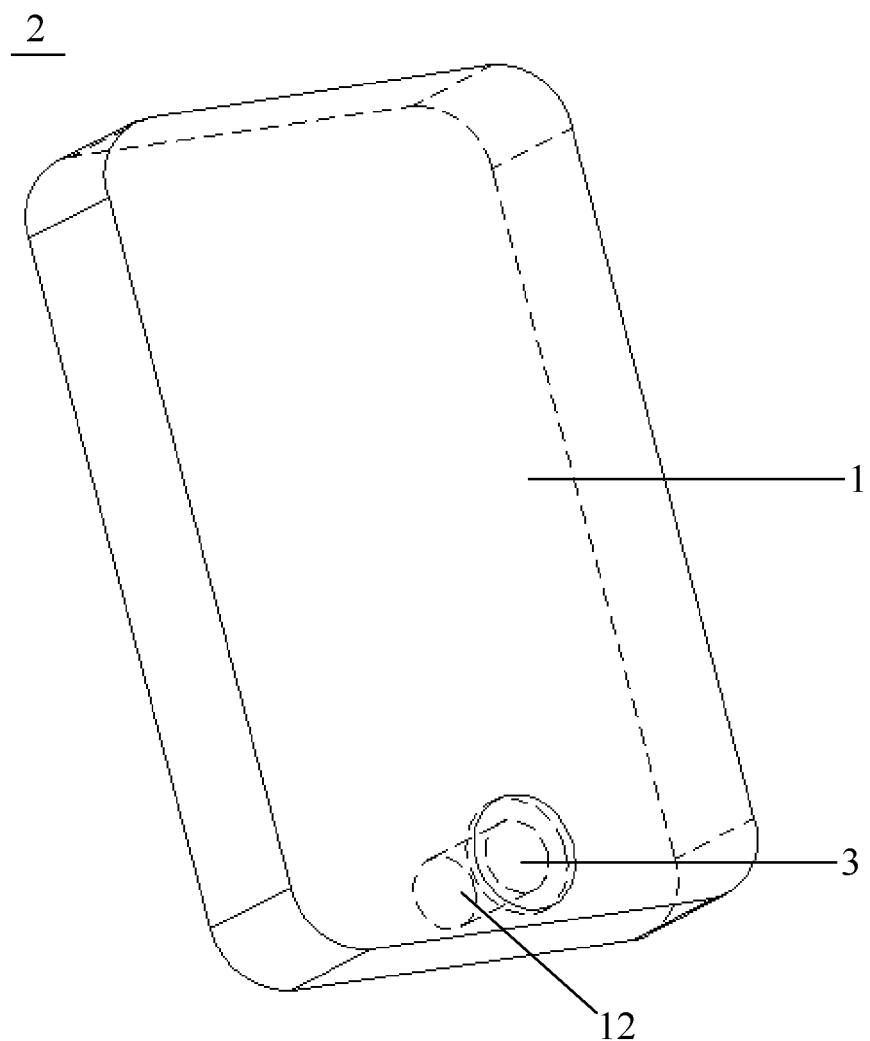
FIG. 14 is a structural diagram of a display apparatus, in accordance with some embodiments.

In yet another aspect, embodiments of the present disclosure provide a display apparatus. FIG. 14 is a structural diagram of a display apparatus, in accordance with embodiments of the present disclosure. As shown in FIG. 14, the display apparatus 2 includes the display substrate 1. No other components are installed in the opening 12 of the display substrate 1, or additional component(s) 3 are installed in the opening 12 of the display substrate 1. The additional component(s) 3 may achieve different functions.

For example, the additional component 3 may be a camera to achieve the function of image acquisition. The additional component 3 may be a handset to achieve the function of sound transmission. The additional component 3 may be a sensor to achieve functions such as distance measurement, temperature detection or fingerprint recognition. The additional component 3 may be a physical key to achieve a key function. The additional component 3 may also be a pointer shaft to achieve a function of installing to a pointer on the pointer shaft.

Of course, the additional component 3 may also be a component that achieves other functions, which is not limited here.

In some examples, in a case where the light-emitting function layer 143 is configured to emit white light, the display apparatus 2 further includes a counter substrate disposed opposite to the display substrate 1. The counter substrate includes a substrate and a color film layer disposed on the substrate so that the white light emitted by the light-emitting function layer 143 in the display substrate 1 show different colors after passing through the color film layer, and thus displays images.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
    a substrate having a display area, an opening located in the display area, and an isolation region disposed around the opening and located between the display area and the opening;
    at least one protruding structure disposed on the substrate and located in the isolation region;
    a water-oxygen barrier pattern covering the at least one protruding structure and located only within a border of the isolation region; and
    a display layer disposed on the substrate, a portion of the display layer being located in the display area, and a remaining portion of the display layer extending into the isolation region; and the remaining portion of the display layer being located proximate to a side of the water-oxygen barrier pattern away from the substrate, wherein
    the water-oxygen barrier pattern is disposed between the remaining portion of the display layer and the substrate in the isolation region.

2. The display substrate according to claim 1, wherein the water-oxygen barrier pattern has at least one through hole.

3. The display substrate according to claim 2, wherein the at least one protruding structure includes a protruding structure disposed around the opening; and
    compared to an orthogonal projection of the protruding structure on the substrate, an orthogonal projection of the at least one through hole on the substrate is closer to the opening.

4. The display substrate according to claim 2, wherein the at least one protruding structure includes a plurality of protruding structures disposed around the opening in a direction from a center of the opening to a border of the opening; and
    compared to an orthogonal projection of an outermost one protruding structure of the plurality of protruding structures on the substrate, an orthogonal projection of the at least one through hole on the substrate is closer to the opening.

5. The display substrate according to claim 4, wherein the at least one through hole is located between two adjacent protruding structures of the plurality of protruding structures.

6. The display substrate according to claim 2, wherein the at least one protruding structure has a first surface and a second surface opposite to each other, and the first surface is farther away from the substrate than the second surface; and
    the at least one through hole is disposed in a portion of the water-oxygen barrier pattern opposite to the first surface.

7. The display substrate according to claim 2, wherein the at least one through hole includes a single through hole disposed around the opening, or a plurality of through holes spaced around the opening.

8. The display substrate according to claim 2, further comprising a thin film encapsulation layer covering the display layer and the water-oxygen barrier pattern, the thin film encapsulation layer including a first inorganic sub-encapsulation layer, an organic sub-encapsulation layer, and a second inorganic sub-encapsulation layer that are sequentially stacked in a thickness direction of the substrate; wherein
    a border of a portion of the first inorganic sub-encapsulation layer extending into the isolation region and a border of a portion of the second inorganic sub-encapsulation layer extending into the isolation region are closer to the opening than a border of a portion of the organic sub-encapsulation layer extending into the isolation region.

9. The display substrate according to claim 8, wherein an orthogonal projection of the at least one through hole on the substrate is closer to the opening than an orthogonal projection of the organic sub-encapsulation layer on the substrate.

10. The display substrate according to claim 8, wherein the at least one protruding structure includes a plurality of protruding structures disposed around the opening in a direction from a center of the opening to a border of the opening; and
    the first inorganic sub-encapsulation layer and the second inorganic sub-encapsulation layer cover all the protruding structures, and the organic sub-encapsulation layer covers part of the plurality of protruding structures.

11. The display substrate according to claim 2, wherein the at least one protruding structure has a first surface and a second surface opposite to each other, and a side face located between the first surface and the second surface; and
    the portion of the display layer extending into the isolation region exposes a portion of the water-oxygen barrier pattern covering the side face.

12. The display substrate according to claim 11, wherein the first surface is farther away from the substrate than the second surface, and an area of the first surface is greater than an area of the second surface.

13. The display substrate according to claim 12, wherein an included angle between the first surface and the side face is within a range of 30° to 90°.

14. The display substrate according to claim 11, wherein the first surface is farther away from the substrate than the second surface;
    the first surface is an arc surface closer to the substrate than a center of a circle corresponding to the arc surface.

15. The display substrate according to claim 11, wherein the display layer includes a light-emitting function layer and an electrode layer located on a side of the light-emitting function layer away from the substrate; and
    the portion of the display layer extending into the isolation region includes: at least one of a portion of the light-emitting function layer that extends into the isolation region and is located on the side of the water-oxygen barrier pattern away from the substrate, and a portion of the electrode layer that extends into the isolation region and is located on the side of the water-oxygen barrier pattern away from the substrate.

16. The display substrate according to claim 2, further comprising a carrier layer disposed on a side of the at least one protruding structure facing the substrate; wherein
the carrier layer is in direct contact with the at least one protruding structure, and both a material of the carrier layer and a material of the at least one protruding structure include organic materials.

17. The display substrate according to claim 2, wherein a material of the water-oxygen barrier pattern includes at least one of an inorganic material, a metal oxide, and a metal material.

18. A display apparatus, comprising:
the display substrate according to claim 1, and
at least one additional component arranged in the opening.

19. The display apparatus according to claim 18, wherein the at least one additional component includes at least one of a camera, an earpiece, a sensor, a physical key, and a pointer axis.

20. A method of manufacturing a display substrate, the method comprising:
providing a substrate, the substrate having a display area, a preset opening region located in the display area, and an isolation region disposed around the preset opening region;
forming at least one protruding structure in the isolation region on the substrate;
forming a water-oxygen barrier pattern covering the at least one protruding structure only within a border of the isolation region;
forming a display layer in the display area, the preset opening region, and the isolation region, a portion of the display layer located in the isolation region being located proximate to a side of the water-oxygen barrier pattern away from the substrate, and the water-oxygen barrier pattern being disposed between the substrate and the portion of the display layer located in the isolation region; and
removing the preset opening region of the substrate and a portion of the display layer located in the preset opening region, so as to form an opening surrounded by the isolation region.

* * * * *